United States Patent [19]
Ferguson, Jr. et al.

[11] Patent Number: 5,311,181
[45] Date of Patent: May 10, 1994

[54] SIGMA DELTA MODULATOR

[75] Inventors: Paul F. Ferguson, Jr., Tewksbury, Mass.; Apparajan Ganesan, Salem, N.H.; Robert W. Adams, Acton, Mass.

[73] Assignee: Analog Devices, Inc., Norwood, Mass.

[21] Appl. No.: 60,890

[22] Filed: May 12, 1993

Related U.S. Application Data

[63] Continuation of Ser. No. 498,941, Mar. 26, 1990, abandoned, which is a continuation-in-part of Ser. No. 472,706, Jan. 31, 1990, Pat. No. 5,055,843.

[51] Int. Cl.[5] .............................. H03M 3/02
[52] U.S. Cl. ........................ 341/143; 375/28
[58] Field of Search .............. 375/27, 28, 60; 341/143; 364/724.1

[56] References Cited

U.S. PATENT DOCUMENTS

| | | | |
|---|---|---|---|
| 3,825,831 | 7/1974 | Ishiguro | 341/143 |
| 4,107,669 | 8/1978 | Tewksbury | 341/143 |
| 4,759,038 | 7/1988 | Takahashi et al. | 341/143 |
| 4,772,871 | 9/1988 | Suzuki et al. | 341/155 |
| 4,796,004 | 1/1989 | Rich et al. | 341/143 |
| 4,937,577 | 6/1990 | Rich et al. | 341/143 |
| 4,965,867 | 10/1990 | Tsuchida et al. | 341/143 |
| 5,068,661 | 11/1991 | Kaneaki et al. | 341/143 |

FOREIGN PATENT DOCUMENTS 0190694 2/1986 European Pat. Off.

OTHER PUBLICATIONS

A 17-bit Oversampling D-to-A Conversion Technology Using Multistage Noise Shaping, Yasuyuki Matsuya, Kuniharu Uchimura, Atsushi Iwata, Takao Kaneko, IEEE Journal of Solid-State Circuits, vol. 24, No. 4, pp. 969-975, Aug., 1989.

Manfred Dietrich, Signal-to-Noise Ratio Improvement of Interpolative Analog-to-Digital Converters, pp. 66-72.

Yasuyuki Matsuya, et al., A 16-Bit Oversampling A-to-D Conversion Technology Using Triple-Integration Noise Shaping, Dec. 1987, pp. 921-929, IEEE Journal of Solid-State Circuits.

Japanese Abstract-Noise Shaping Coder.

B. P. Agrawal, et al., Specification-Based Design of $\epsilon\Delta M$ for A/D and D/A Conversion, pp. 1980-1983.

Primary Examiner—Marc S. Hoff
Attorney, Agent, or Firm—Wolf, Greenfield & Sacks

[57] ABSTRACT

A separate filter circuit is inserted between the D/A converter and the summing junction in the feedback path of a conventional sigma delta modulator. This additional filter allows control of the quantization noise transfer function profile independently of the forward signal transfer function. By proper tailoring of the transfer functions a third or higher order modulator can be constructed without instability developing. The modulator can also be constructed as a completely digital circuit and used as a noise shaping circuit in a digital digital-to-analog converter.

8 Claims, 10 Drawing Sheets

SIGMA DELTA MODULATOR

RELATED APPLICATIONS

This application is a continuation of application Ser. No. 07/498,941, filed Mar. 26, 1990 now abandoned which is a continuation in part of U.S. patent application Ser. No. 07/472,706 filed on Jan. 31, 1990 entitled "SIGMA DELTA MODULATOR" by Paul F. Ferguson, Jr., Apparajan Gameson and Robert W. Adams now U.S. Pat. No. 5,055,843.

FIELD OF THE INVENTION

This invention relates to high-resolution analog-to-digital converters and, in particular, to sigma delta modulators used in such converters.

BACKGROUND OF THE INVENTION

The analog-to-digital (A/D) converter is a key component in many electrical reproduction and measurement systems such as high-quality audio systems (including compact disks and digital audio tape) and high-accuracy measurement systems. Typically, in such systems, high converter resolution and speed are required for overall system accuracy.

Conventionally, high resolution, high-speed A/D converters have used either successive approximation or dual ramp conversion techniques to achieve the required accuracy. In converters using the successive approximation technique, an amplifier with a feedback weighting network is used to successively approximate an analog input signal. However, when such converters are fabricated with conventional monolithic integrated circuit technology, it is usually necessary to adjust the weighting network after fabrication by physical trimming. The trimming must be accurate to achieve high conversion accuracy, and, consequently, as the need for higher converter accuracies increases and the size of the circuit decreases, the trimming operation has become more and more difficult.

Converters using the dual ramp conversion technique require components such as integrators, current sources, comparators and sample-and-hold circuits which have both high speed and accuracy. Typically, these circuits utilize switched capacitors to sample and hold the analog input signal. However, with present integrated circuit technology, it is difficult to fabricate a high-accuracy sample and hold circuit because the charge on the sample and hold capacitor leaks through parasitic capacitances and the switch impedances.

Recently, another A/D conversion technique, called sigma-delta conversion, involving a combination of oversampling and noise shaping has been developed to obtain the required accuracy and speed. This latter technique has an advantage over the successive approximation or dual ramp conversion techniques in that it does not require device trimming or high device tolerances while still achieving the required speed and accuracy.

A typical sigma delta system employs a sigma-delta modulator followed by a digital decimation filter. The modulator converts an analog input signal into a pulse density modulated (PDM) single-bit digital output bit stream. The digital filter, in turn, receives this PDM bit stream and generates a multi-bit pulse code modulated (PCM) output.

While this latter technique has advantages in lowering the device tolerance, the digital decimation filter that is required to convert the PDM signal into a PCM signal is highly complex involving many thousands of transistor elements. Consequently, sigma-delta converters have not been economically competitive with successive approximation or dual ramp converters. However, with the advent of competitively-priced VLSI integrated circuit technology, the sigma-delta converter has been greatly reduced in price and can now compete with the other designs.

The general configuration of a typical sigma-delta converter is shown in FIG. 1 and consists of a modulator 102 in series with a digital decimation filter 108. A frequency-band-limited analog input 100 is applied to the modulator where it is sampled by a sampling clock 104 which operates at frequency that is typically many times greater than the Nyquist sampling frequency. For example, for analog signals in the audio signal bandwidth, the sampling clock may be 2-10 MHz. In such a system, the ratio of the actual sampling frequency divided by the Nyquist frequency is called the "oversampling ratio".

In a manner which will be hereinafter described in detail, modulator 102 produces a PDM at its output 106 (pulse-density-modulated means that the average density of the digital pulses in the output bit stream over a given period of time is approximately equal to the mean value of the analog input over the same period of time). The PDM output is a one-bit output stream at the frequency of the sampling clock. In order to reduce the complexity of modulator 102, a very low resolution analog-to-digital converter is often used in the circuit. This, in turn, produces a large amount of "quantization" noise in the modulator output. However, because the modulator frequency shapes this noise, most of the output quantization noise power is located at frequencies outside of the input signal bandwidth.

Conventional quantization noise analysis indicates that the spectral density of the quantization noise is constant from DC up to one-half the sampling frequency. Consequently, it can be easily shown that as the oversampling ratio increases, the amount of noise in a given bandwidth decreases. As the maximum resolution of the converter is dependent on the amount of noise in the PDM output, the resolution of the converter can be increased by increasing the oversampling ratio. Unfortunately, the converter resolution increases only as the log of the sampling frequency and, consequently, high-resolution converters require prohibitively high sampling frequencies if no noise shaping is performed.

Digital decimation filter 108 is essentially a low-pass digital filter which passes signals in the band of interest but cuts off the quantization noise which is out of band. The filter produces a multi-bit PCM output (typically 12-18 bits) at a frequency which is much lower than the incoming PDM bit stream, and consequently, can be viewed as a PDM to PCM converter. During the PDM to PCM conversion, the output frequency may be lowered from the sampling clock frequency to a frequency range close to the Nyquist sampling rate for the analog input frequency range. While such a filter is complex, it is conventional in construction and operation and will not be described further herein.

A more detailed block diagram of a conventional modulator 102 is shown in FIG. 2 wherein the modulator consists of an A/D converter 212 surrounded by a feedback circuit. The feedback circuit includes summing junction 202, filter circuit 204 and a D/A converter 218. In particular, an analog input X(z) at input 200 is provided to sampling switch 201 which samples the input at the frequency of the sampling clock. The output of switch 201 is provided to summing junction 202 and the output of summing junction 202 is, in turn, provided to filter 204 and from there to A/D converter 210. A/D converter 210 is also controlled by sampling clock 212 to convert the analog signal produced by filter 204 to an output PDM digital signal Y(z).

The output Y(z) is fed back by means of line 216 to D/A converter 218 which reconverts the digital output to an analog signal. This analog signal is then applied, via lead 206, to the negative input of summing junction 202. Consequently, unless the output Y(z) is exactly the same as the input X(z), an error signal will be developed by summing junction 202 which will then pass through the loop to correct the output. The operation of the feedback loop causes the digital output Y(z) to oscillate around the value of the analog input with the amplitude of the oscillations constituting quantization noise. In a typical sigma delta modulator, both A/D unit 210 and D/A unit 218 are very coarse converters and may, in fact, consist of single-bit converters. Consequently, the quantization noise introduced into the system by these devices is considerable. However, with certain assumptions, it is possible to treat the quantization noise as if it were produced by a white noise source Q(Z) and added to the output signal at the position of A/D converter 210 a shown by the dotted lines in FIG. 2.

Overlooking the sampled data nature of the modulator for the present time and viewing the circuit as a linear circuit, it can be shown by conventional filter theory that the forward transfer function of such a circuit is given by:

$$\frac{Y(z)}{X(z)} = \frac{G(z)}{1 + G(z)} \quad (1)$$

However, the transfer function from the noise source Q(Z) to the output is given by:

$$\frac{Y(z)}{Q(z)} = \frac{1}{1 + G(z)} \quad (2)$$

FIG. 3A is a plot of the signal gain (in dB) versus frequency of the forward transfer function Y(z)/X(z) whereas FIG. 3B is a plot of the quantization noise transfer function Y(z)/Q(z). In accordance with equation (1) above, FIG. 3A the transfer function Y(z)/X(z) appears as a low-pass filter determined by the characteristics G(z) of filter circuit 204. However, as FIG. 3B illustrates the transfer function for the noise Q(z) is that of a high-pass filter. Consequently, the effect of the feedback and filter circuit is to reduce the quantization noise Q(z) power at lower frequencies and increase it at higher frequencies.

If, for example, the cutoff frequency of decimation filter 108 (FIG. 1) is of (shown by the dotted lines in FIGS. 3A and 3B), then for the frequency band between DC and of the input signal as shown by FIG. 3A will not be attenuated whereas the quantization noise (as shown by FIG. 3B) will be highly attenuated.

The configuration suffers from several problems. More particularly, if filter 204 is a first "order" filter, the quantization noise passing through the system is highly correlated so that the oversampling ratio needed to achieve resolution greater than approximately 12 bits is prohibitively large. One prior art method to overcome this problem is to add a small "dither" signal to the input of filter 204. This signal spreads the input signal spectrum over a larger range and de-correlates the quantization noise from the input signal.

Another prior art method to avoid noise correlation and to reduce the amount of quantization noise in the digital filter passband is to either increase the sampling frequency (as mentioned above) or to increase the slope of the noise transfer function in the passband by increasing the "order" of filter 204.

A circuit utilizing a higher order filter is shown in FIG. 4. The modulator shown in FIG. 4 has characteristics similar to FIG. 2 and analog input 400 is provided to a summing junction 402. However, filter 204 shown in FIG. 2 has been split into two single order integrators 404 and 418 joined by a second summing junction 412. The output 406 of summing junction 402 is provided to integrator 404 and the output of 410 of integrator 404 is, in turn, provided to summing junction 412. The output 414 of junction 412 is provided to the second integrator 418. The output 420 of integrator 418 is provided to A/D converter 422 which generates the PDM output 424.

As with the single order modulator, the digital output is fed back, via lead 426, to a D/A converter 428. The output of the D/A converter is provided via leads 408 and 416 to the summing junctions 402 and 412, respectively. This modulator operates in similar manner to that shown in FIG. 2 with the exception that the slope on the noise transfer curve shown in FIG. 3B is steeper in accordance with conventional filter theory.

Higher order sigma delta modulators containing more than two integrators in the forward path theoretically offered the potential of even further increases in resolution. However, it was found that modulators with more than two integrators suffered from instability due to the accumulation of large signals and phase lags in the integrators which tends to reduce the average gain of the quantizer. Consequently, third or higher order modulators with the basic architecture shown in FIG. 4 were not designed because these modulators were marginally stable and it was believed that they would oscillate.

Various alternative approaches, however, have been used to construct higher order modulators. One such scheme is shown in FIG. 5. This circuit uses a second order filter comprised of integrators 514 and 520 combined with both feed-forward and feedback paths to achieve the required noise shaping. In particular, the analog input on lead 500 is provided to a summing junction 502. The output of summing junction 502 is provided to integrator 514 and the output 516 of integrator 514 is, in turn, provided to integrator 520. Summing junction 502 is provided with feedback 510 from the feedback D/A converter 536. However, in addition, the summing junction 502 is provided with feedback from another summing junction 504 which in turn receives feedback from the output of each of the integrators. More particularly, the output of integrator 514 is applied, via lead 518 and amplifier 508, to summing junction 504 and the output of integrator 520 is applied, via lead 522 and amplifier 506, to summing junction 504.

In a similar manner, the outputs of integrators 514 and 520 as well as the output of summing junction 502 are applied to a further summing junction 530 via amplifiers 524–528. The output of this latter summing junction is, in turn, applied, via lead 538, to A/D converter 534 which produces the PDM modulated output 540.

The circuit in FIG. 5 is a combination of both an interpolative and a predictive modulator. The feedback signal developed by summing junction 504 acts in an interpolative manner and causes the feedback loop to filter the quantization noise generated by the A/D converter 534. Alternatively, the feed-forward signal developed by summing junction 530 acts as in a predictive manner and causes the output of the feedback loop to predict the input. Any resulting error is quantized and used to make the next prediction.

The filter arrangement shown in FIG. 5 can improve the signal-to-noise ratio of the modulator. However, the configuration requires coefficient summing junctions 504 and 530 at both the input and the output of the circuitry. Thus, either a high-accuracy, high-speed amplifier must be used to implement the summing junctions or the signals must be added by connecting them to a summing capacitor. In the latter case, the outputs are subject to distortions and inaccuracies due to parasitic capacitances in parallel with the summing capacitor.

A third type of prior art circuit is shown in FIG. 6. This circuit utilizes what is known as "MASH" technology. In this arrangement, three first-order sigma-delta modulators (each with a configuration shown in FIG. 2) are cascaded in series and their outputs are summed together to form the final PDM output. In particular, the analog input on lead 600 is applied to a first sigma-delta modulator (SDM) 602. The PDM output 604 is summed with the output of the internal filter circuit P(z) shown in FIG. 2. The error signal developed by summer 606 is provided, via lead 608, to a second first-order SDM 610. The output of modulator 610 (on lead 614) is, in turn, summed with the filter signal P(z) on lead 619 in summer 618. The output of summer 618 is, in turn, provided, via lead 620, to a third first-order SDM 612.

The outputs 604, 614 and 622 of the three SDMs 602–612 are then processed to generate the final output. More particularly, the output of the second SDM 610 is differentiated, via differentiator 616, and applied to summing junction 634 via lead 630. The output 622 of the third SDM 612 is differentiated twice by differentiators 624 and 626 and provided, via lead 632, to summing junction 634. The output of summing junction 634 is summed with the output of SDM 602 on lead 628 in junction 636 to produce the final output 638.

The circuit shown in FIG. 6 has the potential of achieving high resolution since the coarse quantization error produced by the first SDM 602 is successively corrected in each further stage. Unfortunately, this prior art arrangement has two significant problems. In particular, since the output 638 is the sum of several different signals, it is no longer a single-bit signal but rather a multi-bit signal. The multi-bit signal requires more complex processing circuitry in the remainder of the converter (in particular, in the digital filter). Secondly, the outputs of the second and third sigma delta modulators 610 and 612 must be differentiated to combine them. An error will occur if the differentiation is not the precise inverse of the integration implicitly performed by modulators 602 and 610. Since the outputs 614 and 622 of modulators 610 and 612 are digital signals, a near-perfect differentiator can be constructed. Thus, integrator errors will allow quantization noise from SDM 602 and 610 to "leak" into the PDM output (since the noise from these stages is shaped with low order SDM's, it contains appreciable spectral tones).

Accordingly, it is an object of the present invention to provide a sigma delta modulator which has both high-resolution and high speed.

It is another object of the present invention to provide a sigma delta modulator in which the filter order can be increased beyond second order without suffering instability.

It is a further object of the present invention to provide a sigma delta modulator which has reduced complexity and can be easily fabricated by monolithic circuitry.

It is still another object of the present invention to provide a sigma delta modulator in which recovery from transients can be accomplished easily.

It is yet another object of the present invention to provide a sigma delta modulator which can be fabricated using switched capacitor circuitry.

It is still another object of the present invention to provide a digital sigma delta modulator which can be used as a digital noise shaper in a digital digital-to-analog converter.

SUMMARY OF THE INVENTION

The foregoing objects are achieved and the foregoing problems are solved in one illustrative embodiment of the invention in which a separate filter circuit is inserted between the D/A converter and the summing junction in the feedback path of a conventional sigma delta modulator. This additional filter allows control of the quantization noise transfer function profile independently of the forward signal transfer function. By proper tailoring of the transfer functions a third or higher order filter can be constructed without instability developing.

In a preferred embodiment, both the forward signal filter circuit and the feedback path filter circuit are constructed as distributed circuits consisting of a plurality of discrete, single-order filter circuits cascaded together. Feedback from intermediate nodes in the cascaded feedback circuit is applied to intermediate summing junctions located between the discrete filter units in the forward path. With a proper choice of the feedback nodes, feedback can be applied at the input of each single-order filter circuit and thus, in the case of an overload condition, each filter circuit can be controlled directly by the feedback to control oscillations even if a preceeding stage should saturate.

In another embodiment, the entire sigma delta modulator circuit is constructed as a digital circuit so that it can be used as a digital noise shaper. The digital noise shaper may then be used in a digital-to-analog converter which processes a sampled analog input signal to generate a frequency-shaped single-bit output signal. The output signal can then be filtered to obtain the original analog input.

DETAILED DESCRIPTION OF A PREFERRED EMBODIMENT

Figure 1:
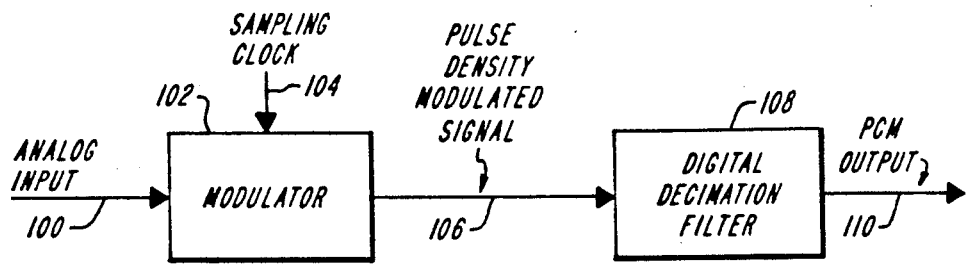
FIG. 1 is a block electrical schematic diagram of the typical prior art analog-to-digital converter using a sigma delta modulator.
Figure 2:
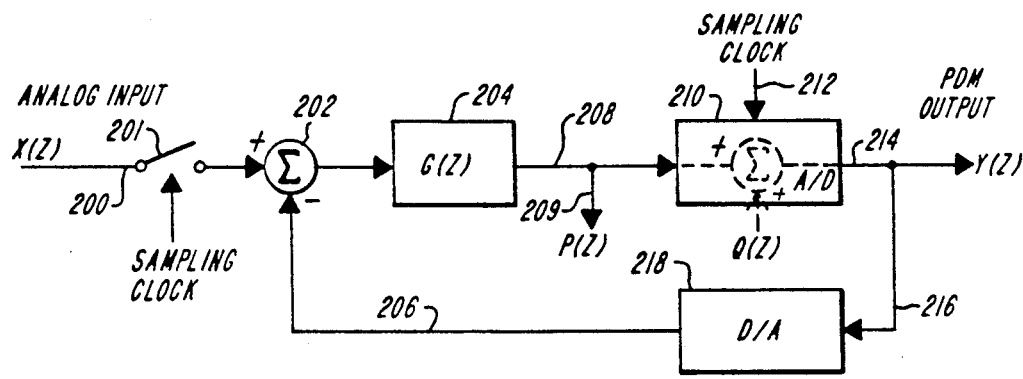
FIG. 2 is an electrical block schematic diagram of a conventional sigma delta modulator.
Figure 7:
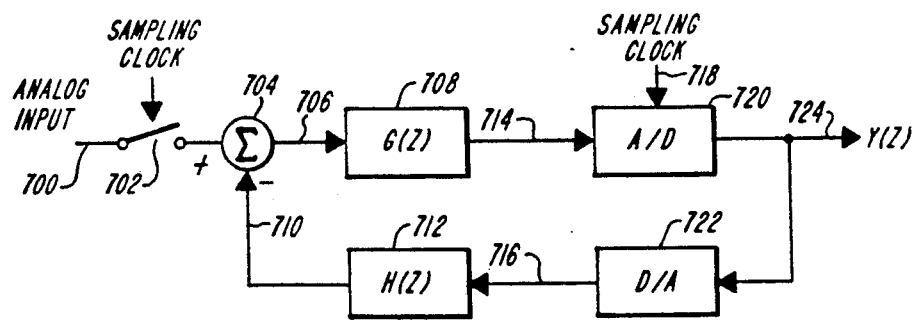
FIG. 7 is an electrical block schematic diagram of the inventive sigma delta modulator.

FIG. 7 shows a block diagram of the inventive sigma delta modulator. A comparison of FIG. 7 and FIG. 2 indicates that the inventive modulator has an additional filter element, 712, in the feedback loop. In particular, the analog input on lead 700 is applied, via sampling switch 702, to a summing junction 704. The output 706 of summing junction 704 is applied to filter unit 708 and the output 714 of this latter filter unit is, in turn, applied to A/D converter 720. Converter 720 is controlled to operate at the sampling clock frequency via the sampling clock provided on lead 718.

The output of converter 720 on lead 724 is the pulse density modulated output Y(z). This output is fed back, via the output 716 of D/A converter 722, to filter unit 712. The output 710 of filter unit 712 is, in turn, applied to summing junction 704.

From conventional theory, it can easily be shown that the linear forward transfer function is:

$$\frac{Y(z)}{X(z)} = \frac{G(z)}{1 + G(z)H(z)} \quad (3)$$

and the noise transfer function (assuming that the quantization noise introduced by A/D converter 720 is equivalent to additive white noise at the position of converter 720 is:

$$\frac{Y(z)}{Q(z)} = \frac{1}{1 + G(z)H(z)} \quad (4)$$

Figure 3A:
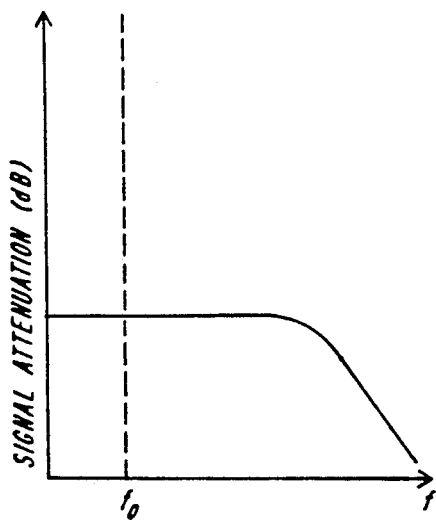
FIGS. 3A and 3B illustrate the signal transfer function and the noise transfer function for tho circuit shown in FIG. 2.
Figure 3B:
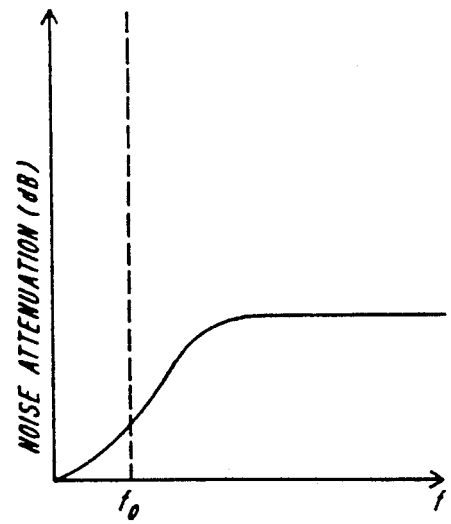
Figure 4:
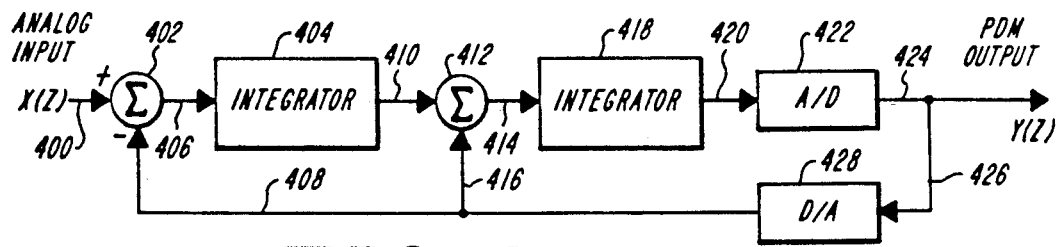
FIG. 4 is an electrical block schematic diagram of a prior art second order sigma delta modulator.
Figure 5:
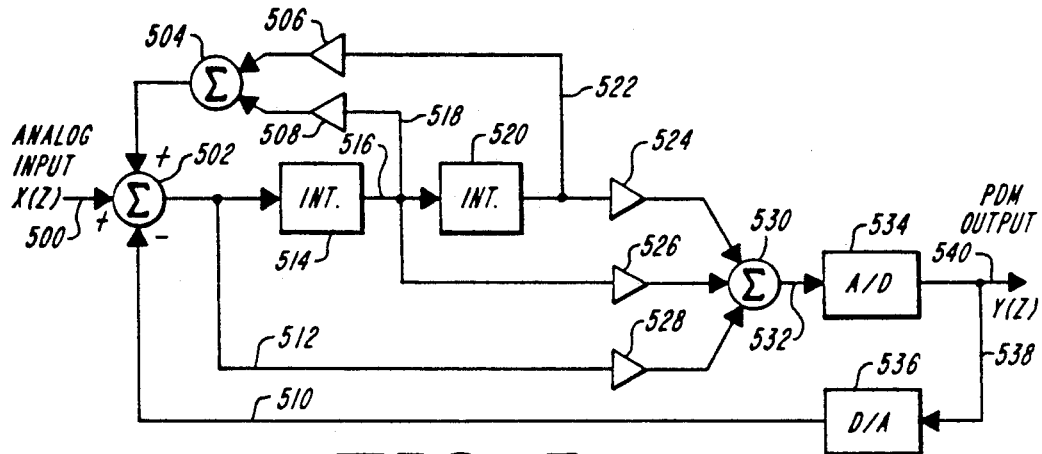
FIG. 5 is an electrical block schematic diagram of another prior art sigma delta modulator.
Figure 6:
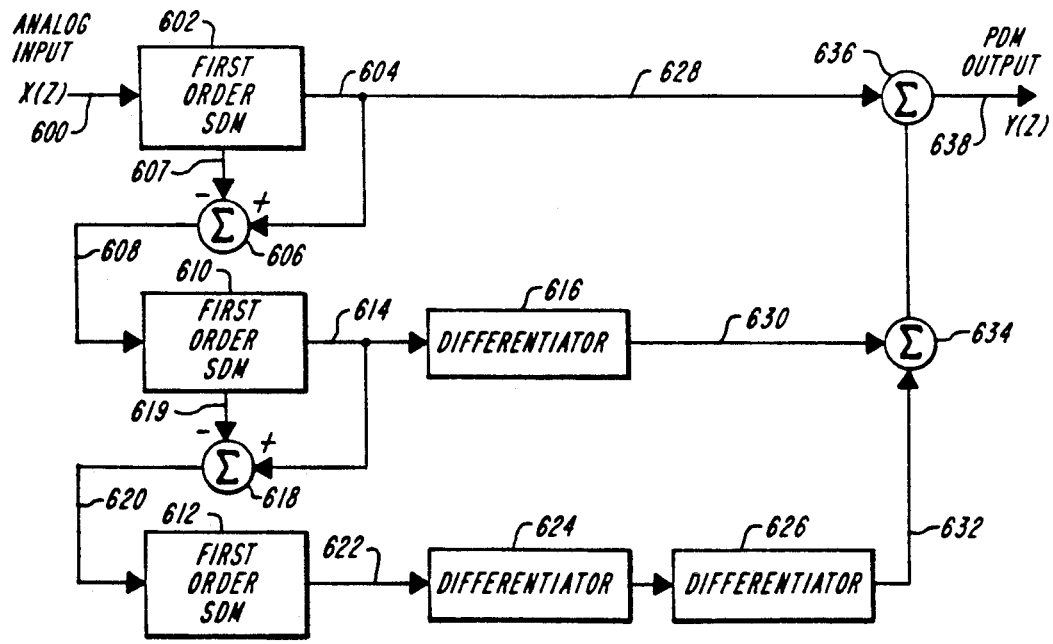
FIG. 6 is an electrical block schematic diagram of still another prior art sigma delta modulator using a MASH topology.

These transfer functions have the general shape shown in FIGS. 3A and 3B, respectively. However, the transfer functions now depend on both of the functions G(z) and H(z). Consequently, by proper choice of the functions G(z) and H(z), the forward transfer function can be specified independently of the noise transfer function.

Figure 8A:
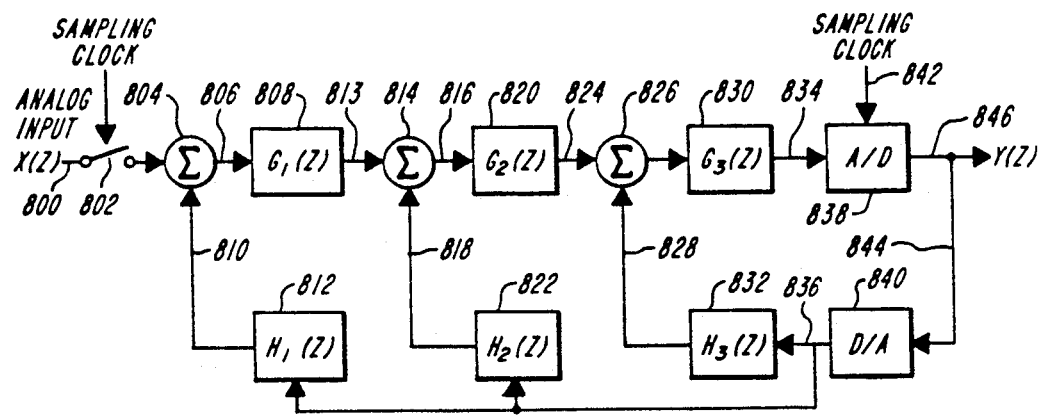
FIG. 8A is an electrical block schematic diagram of a preferred embodiment of the inventive sigma delta modulator using distributed filters.

In accordance with another embodiment of the invention, as shown in FIG. 8A, both the forward filter circuit and the feedback filter circuit can be implemented as distributed circuits. In particular, as shown in FIG. 8A, the forward filter function G(z) shown in FIG. 7 as circuit 708 can be divided into two or more discrete functions G1(z)–G3(z) corresponding to circuits 808, 820 and 830. Similarly, the feedback filter function H(z) shown in FIG. 7 as circuit 710 can be divided into two or more portions H1(z)–H3(z) corresponding to circuits 812, 822 and 832. In the configuration shown in FIG. 8A, the three forward functions 808, 820 and 830 are cascaded in series with summing junctions 804, 814 and 826. Each of the summing junctions receives a feedback signal from the outputs 810, 818 and 828 of the distributed feedback elements 812, 822 and 832, respectively. The A/D converter 838 and D/A converter 840 function the equivalent components in the embodiment shown in FIG. 7.

The circuit shown in FIG. 8A has an advantage over the modulator circuit shown in FIG. 7 in that the input of each forward filter circuit, 808, 820 and 830, is directly under control of a corresponding feedback signal, 810, 818 and 828. In the FIG. 7 embodiment, if the function G(z) is implemented by means of a higher-order filter with multiple cascaded stages, the relatively noisy output of the D/A converter 722 can cause some of the filter stages to saturate. If the input filter stage of a cascaded filter chain saturates, the remaining stages in the cascade are effectively disconnected from the feedback signal and are thus no longer under control. Consequently, the modulator may require a long interval of time to recover from noise and non-linearities which saturate some of the stages.

In the distributive embodiment shown in FIG. 8A, a multiple-order filter can be constructed from a plurality of single order stages. If one of the stages saturates, the remaining stages are still under control of the feedback loop and, thus, the entire circuit can quickly recover from transients and noise. Consequently, non-linearities in the input are handled more easily in the FIG. 8A distributed embodiment than in the FIG. 7 lumped embodiment.

Figure 8B:
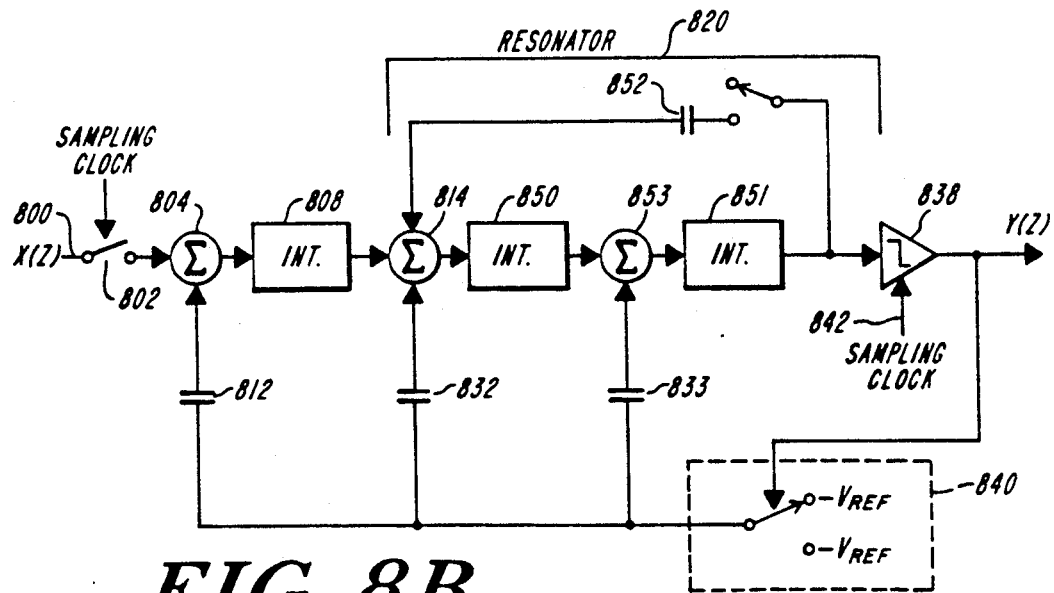
FIG. 8B is an electrical block schematic diagram of a third order inventive sigma delta modulator using an integrator and resonator in series with distributed feedback.

A specific embodiment of the FIG. 8A modulator is shown in FIG. 8B. The 8B embodiment utilizes a third order filter circuit as the transfer function G(z). It is possible to construct a third-order filter by cascading three integrators as illustrated in FIG. 8A. However, the FIG. 8B embodiment uses a conventional noise-shaping technique to further reduce the quantization noise power within the passband of the output digital filter.

More particularly, although increasing the order of the G(z) filter circuit increases the slope of the transfer function within the passband and decreases the noise power at low frequencies, a substantial amount of noise is still present at the high frequency end of the passband because the G(z) transfer function increases rapidly in this area. In a known manner it is possible to manipulate the transfer function to lower the total quantization noise power over the entire passband. This can be done by moving one or more pairs of complex zeroes in the transfer function from DC (where they would occur if the filter were a cascade of integrators) to another frequency within the passband. Each zero produces a "notch" in the frequency response of the quantization noise transfer function.

Figure 9:
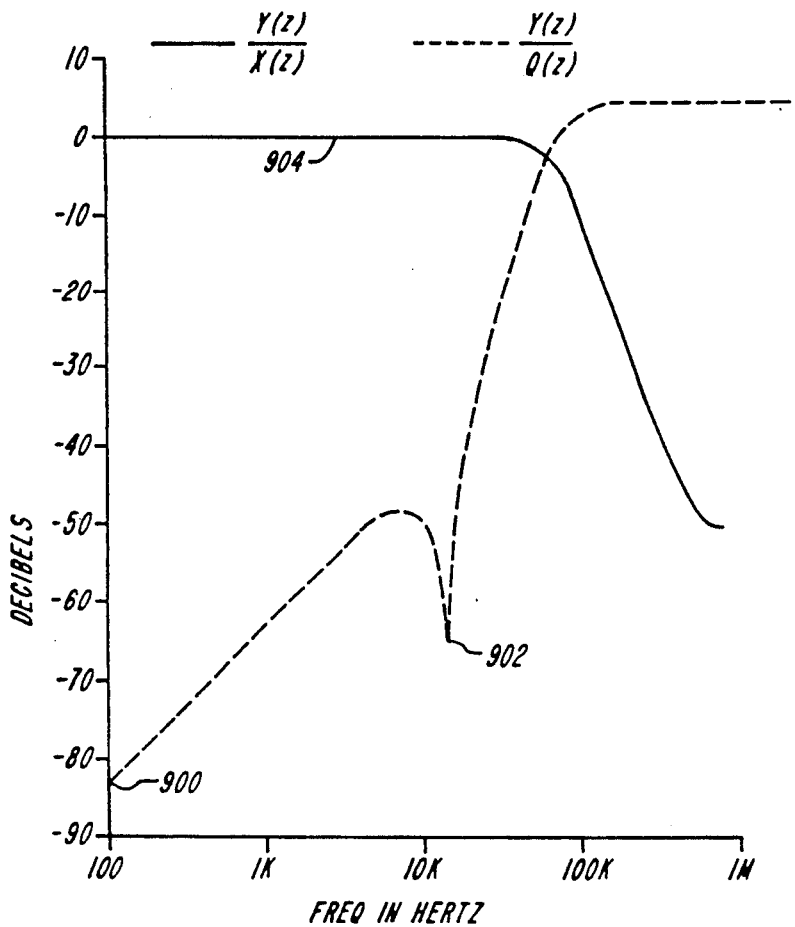
FIG. 9 is an attenuation versus frequency plot of both the signal transfer function and the noise transfer function for the circuit shown in FIG. 8B.

For example, in FIG. 9, the transfer functions of both the signal (Y(z)/X(z)) and noise (Y(z)/Q(z)) are shown. As previously mentioned, the signal transfer function 904 is relatively flat within the decimation filter passband and the noise transfer function climbs sharply near the outer end of the passband. A notch in the noise transfer function has been introduced at point 902 by appropriately designing the filter circuitry. This notch has the effect of increasing the noise near the lower end of the passband, but decreasing the noise at the upper end of the pass band. Since the slope of the transfer function is relatively steep towards the upper end of the pass band, the overall effect is to reduce the total noise energy within the pass band.

The noise transfer function shown in FIG. 9 can be implemented by means of an integrator cascaded with a resonator. The integrator produces a zero at DC frequency producing infinite attenuation at DC whereas the resonator produces the notch at point 902.

Consequently, returning to FIG. 8B, the illustrative circuit uses an integrator 808 cascaded with a resonator 820. Resonator 820 consists of integrator 850, integrator 851 and feedback capacitor 852. In particular, the analog input signal on lead 800 is sampled by a sampling switch 802 and provided to a summing junction 804. The output of the summing junction is provided to integrator 808 and the output of the integrator is, in turn, provided to summing junction 814. The output of summing junction 814 is provided to integrator 850. The output of integrator 850 is provided to summer 853, whose output is connected to the input of integrator 851. The output of integrator 851 is fed back through capacitor 852 to summer 814. The output of integrator 851 is, in turn, provided to A/D converter or quantizer 838. A/D converter 838 may be a multiple-bit converter for increased accuracy, but in accordance with conventional design practice, a single-bit comparator 838 is used as an A/D converter. The use of a comparator simplifies the circuitry and eliminates non-linearities present in multiple bit converters. Comparator 838 is clocked by means of a sampling clock on lead 842.

The output 846 of comparator 838 (which constitutes the pulse density modulated signal Y(z) is, in turn, provided to D/A converter 840. This consists of a simple one-bit converter constructed by means of a switch controlled by comparator 838 that applies either a plus or minus reference voltage ($V_{ref}$) to feedback lead 836. The signal on lead 836 is applied, via the feedback network to summing junctions 804 and 814. In the illustrative embodiment, feedback network comprises three capacitors 812, 832 and 833.

Figure 10:
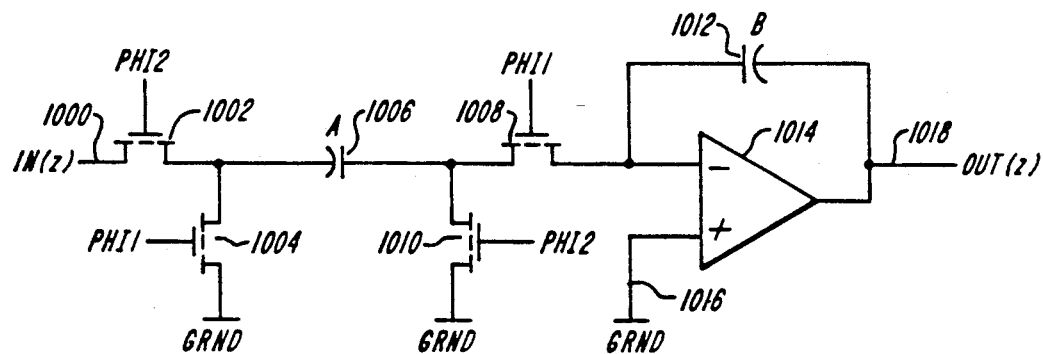
FIG. 10 is an electrical schematic diagram of an illustrative integrator circuit fabricated with conventional switched capacitor circuitry.

The illustrative embodiment can be fabricated using conventional switched capacitor technology to implement integrator 808 and resonator 820. More particularly, a switched capacitor implementation of integrator 808 is shown in FIG. 10 and consists of a switched capacitor circuit in series with an integrator. The switched capacitor circuit consists of capacitor 1006 and associated MOS switches 1002-1010 and the integrator is comprised of operational amplifier 1014 and integration capacitor 1012.

Figure 11:
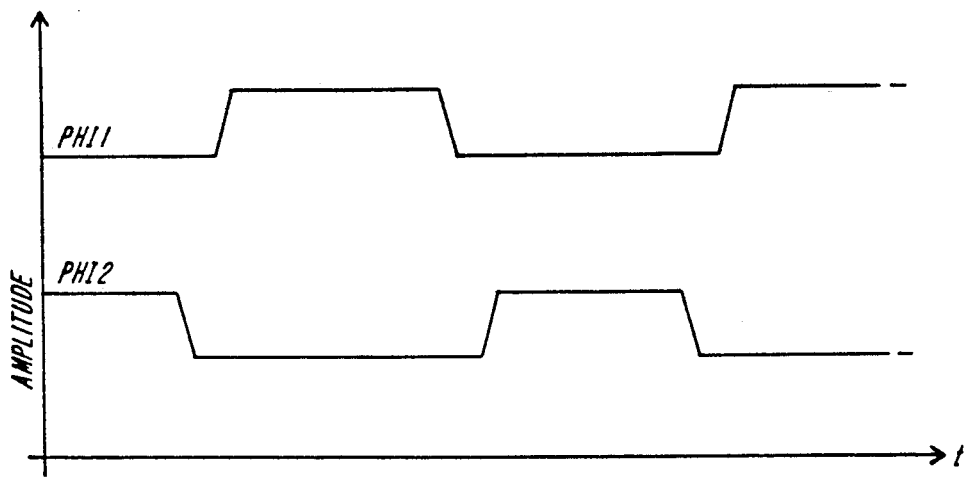
FIG. 11 is a waveform diagram of clock signals used to operate the integrator shown in FIG. 10.

Sampling switches 1002-1010 are driven by two non-overlapping clock signals shown in FIG. 11 and designated as PHI1 and PHI2. These signals are arranged so that when PHI1 is active (high), PHI2 is inactive (low). Both signals ar periodic at the sampling frequency.

The clock signals are applied to the integrator in FIG. 10 and control switches 1002-1010 to sample the input analog signal. More particularly, input signal IN(z) on lead 1000 is applied to MOS switch 1002. During the active phase of clock signal PHI2, MOS switches 1002 and 1010 are closed. Thus, capacitor 1006 charges to the value of IN(z) over the circuit path: lead 1000, switch 1002, capacitor 1006 and switch 1010 to ground.

At the end of the active phase of clock PHI2, switches 1002 and 1010 open. Next, during the active phase of clock PHI1, MOS switches 1004 and 1008 close. Capacitor 1006 thereupon discharges through the path consisting of ground, switch 1004, capacitor 1006, switch 1008 and the negative input of operational amplifier 1014 (which is held at "virtual" ground by means of the negative feedback connection). Since sampling switches 1002-1010 operate in a periodic manner, the assembly of capacitor 1006 and switches 1002-1010 appears as a resistor at frequencies much less than the sampling frequency.

Operational amplifier 1014 is connected in a conventional negative feedback arrangement and operates as an integrator due to integration capacitor 1012 in the feedback loop. The signal at the negative input of operational amplifier 1014 is integrated in a conventional manner since the positive input of amplifier 1014 is grounded. Thus, the output 1018 produces the signal OUT(z) which is the integral of the signal IN(z).

Figure 12:
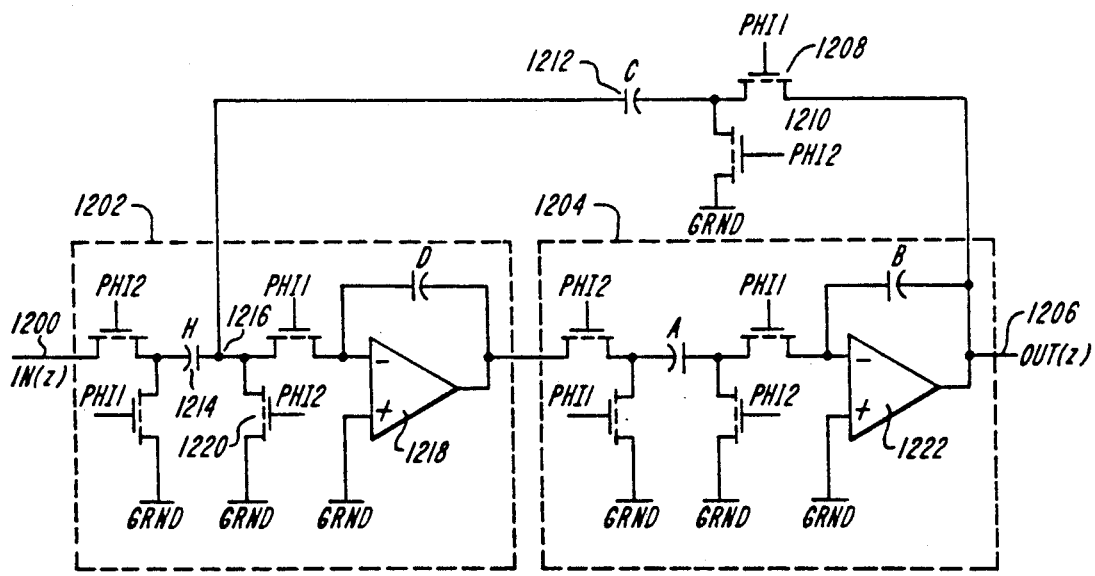
FIG. 12 is an electrical schematic diagram of an illustrative resonator circuit implemented via switched capacitor circuitry suitable for use in the circuit shown in FIG. 8B.

A switched capacitor implementation for resonator 820 in FIG. 8B is shown in FIG. 12. The resonator consists of two integrators 1202 and 1204 cascaded in series. Each of the integrators is equivalent to that shown in FIG. 10 and operates in a similar manner. The output of integrator 1204 is connected via a feedback loop to the input of integrator 1202 by means of resonator capacitor 1212 and switches 1208 and 1210. During the active phase of clock PHI1, the output 1206 of integrator 1204 is connected, via resonator capacitor 1212, to junction 1216 of resonator 1202. This connection effectively places resonator capacitor 1212 in parallel with sampling capacitor 1214 with the effect that point 1216 acts as a summing junction for the input to the operational amplifier 1218 of integrator 1202. A separate summing junction that would otherwise be required is thereby eliminated.

During the active phase of clock PHI2, switch 1208 opens and switches 1210 and 1220 close and thus capacitor 1212 is discharged. Thus, the cascade of the two integrators with feedback produces a resonator at a predefined frequency which can be adjusted by controlling the characteristics of each integrator and the value of the resonator capacitor 1212. Consequently the transfer function from the input 1200 to the output 1206 (OUT(z)/IN(z)) has an infinite peak at a predetermined resonation frequency.

Figure 13:
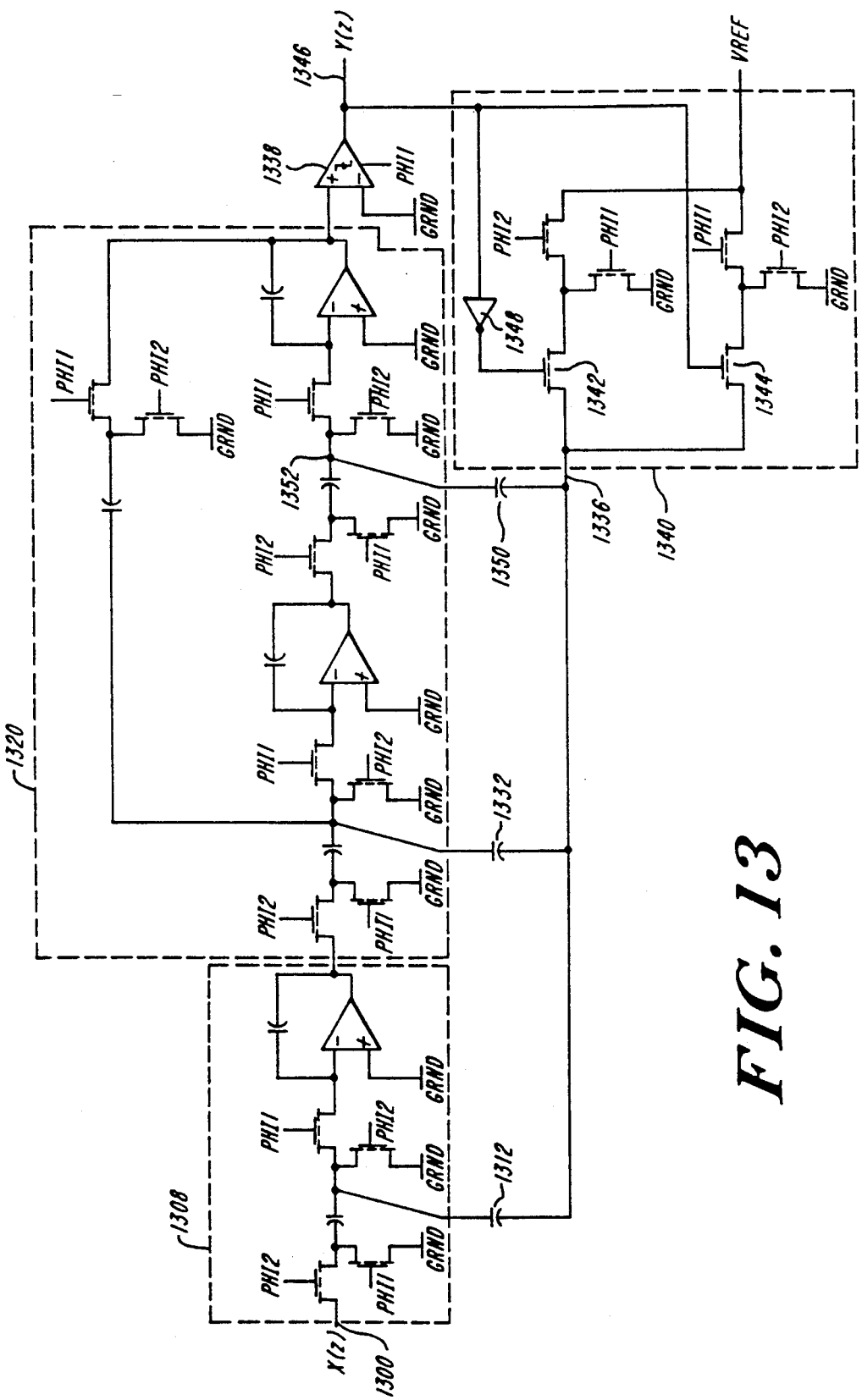
FIG. 13 is a complete circuit diagram of one embodiment of an inventive third order sigma delta modulator implemented with switched capacitor circuitry.

FIG. 13 shows a detailed schematic diagram of one illustrative embodiment of an inventive sigma delta modulator. The modulator has the configuration shown in FIG. 10 and is comprised of an integrator 1308 cascaded with a resonator 1320. The output of resonator 1320 is provided to comparator 1338 which develops the PDM output Y(z). The output 1346 is also provided to D/A converter 1340. Converter 1340 is essentially a one-bit switch equivalent to switch 1140 in FIG. 10 with the exception that only a single polarity reference voltage ($V_{ref}$) is used. Converter 1340 takes advantage of the fact that changing the clock phases which drive a set of sampling switches can cause the switches to appear as either a positive or a "negative" resistor. Thus, the single reference voltage $V_{ref}$ in FIG. 13 can be made to appear as a positive and negative voltage. The positive and negative reference voltages are selectively gated onto feedback lead 1336 by means of MOS switches 1342 and 1344 operating under control of output 1346 and invertor 1348.

The signal on feedback lead 1336 is, in turn, applied to integrator 1308 and resonator 1320 by means of feedback capacitors 1312 and 1332. Feedback is also applied to the inner node 1352 of resonator 1320 by means of feedback capacitor 1350. This latter connection allows more close control over the resonator sections should the first resonator section saturate as discussed above. With the connections as shown the circuit operates in the manner previously discussed with respect to FIG. 10.

One potential drawback of the circuit of FIG. 8B is that the signal transfer function Y(z)/X(z) rolls off at a rate equal to the order of the loop filter. For example, a third-order SDM would exhibit a third-order low-pass characteristic at some frequency above the band of interest. Even though the signal frequency response is flat in the band of interest, in some situations, a faster time-domain transient response may be required. More particularly, it is well-known that higher-order SDMs may oscillate if their inputs are severely overdriven, and may continue to oscillate even after the overloading signal has been removed. A common cure to this problem is to incorporate a circuit which detects oscillation by looking for long consecutive strings of digital "ones" or "zeroes" in the PDM output. When such oscillations are detected, stability is restored by forcing all integrator outputs to zero. After the integrators have been reset, they ar released and the circuit begins to recover. If the recovery is too slow, an inaccurate value or "glitch" can appear at the decimated output of the A/D converter.

Figure 14:
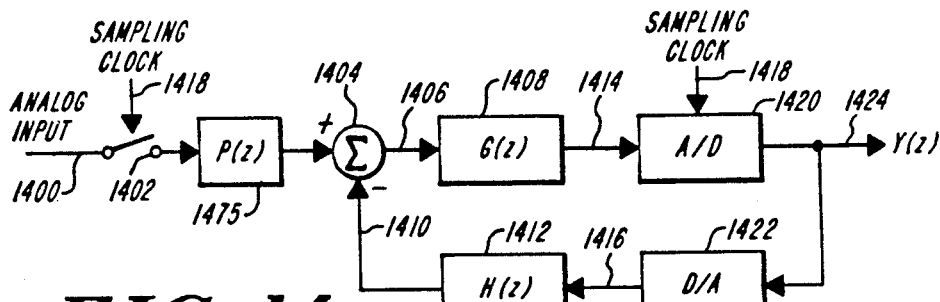
FIG. 14 is an electrical block schematic diagram of an illustrative modulator circuit similar to that shown in FIG. 7, but incorporating a pre-filter circuit to improve transient response.

FIG. 14 shows a block diagram of another illustrative embodiment of a SDM which is similar to the circuit of FIG. 7 except that a prefilter function P(z) (1475) has been added in series with input 1400 and summing juction 1404. Similar elements in FIGS. 7 and 14 have been given equivalent numeric designations. For example, filter 708 corresponds to filter 1408, etc. The purpose of pre-filter 1475 is to provide gain at high frequencies that partially cancels the low-pass roll-off characteristics of the signal transfer function of the SDM loop.

Figure 15:
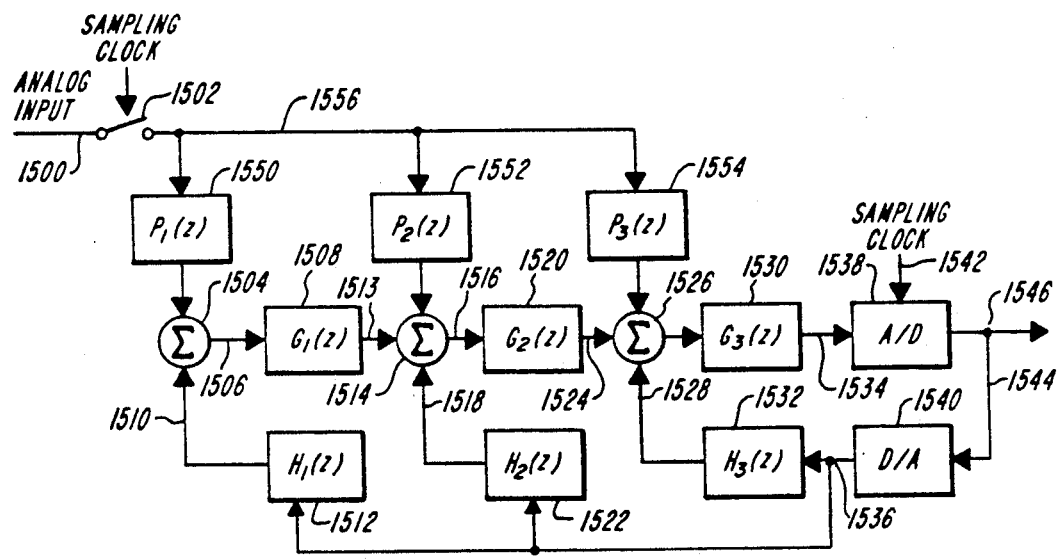
FIG. 15 is an electrical block schematic diagram of an illustrative modulator circuit similar to that shown in FIG. 8A, but incorporating a distributed pre filter circuit to improve transient response.

FIG. 15 is a block diagram of another illustrative embodiment which shows how the pre-filter output signals in FIG. 14 can be distributed to the inputs of the integrators in the same manner that the feedback filter H(z) was distributed in FIG. 8A. As with FIGS. 7 and 14, similar elements in FIG. 15 have been given equivalent numeric designations as those in FIGS. 7 and 14. For example, filter 1508 corresponds to filters 708 and 1408, etc. The filter function P(z) has been distributed in three discrete prefilters 1550, 1552 and 1554. Prefilters 1550, 1552 and 1554 ar connected in parallel to analog input line 1556 and apply partial prefilter signals to summing junctions 1504, 1514 and 1526, respectively.

Figure 16:
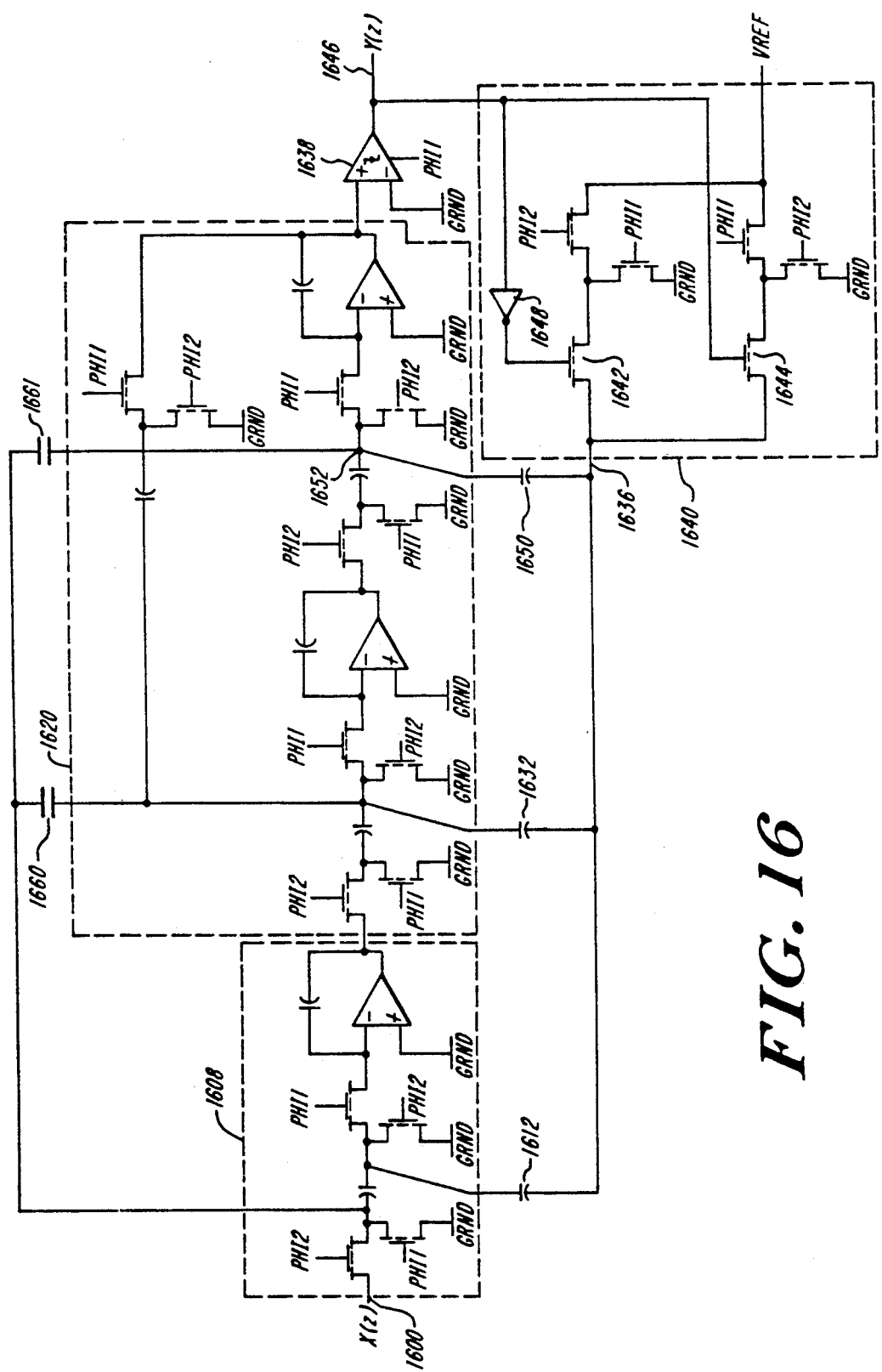
FIG. 16 is an electrical schematic diagram of an illustrative modulator circuit similar to that shown in FIG. 13 and implemented with switched capacitor technology, but incorporating a distributed pre-filter circuit to improve transient response.
Figure 18A:
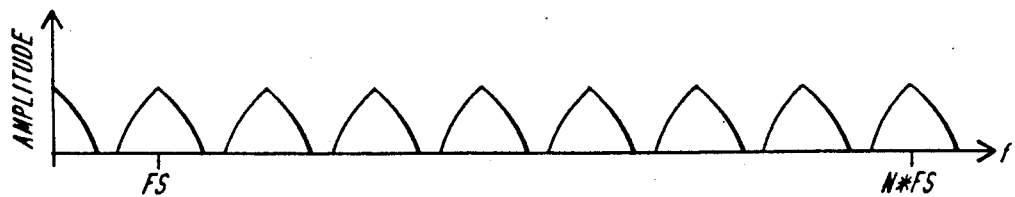
FIGS. 18A–18D show frequency plots of the signal stream at various labelled points, in the circuit of FIG. 17.
Figure 18B:
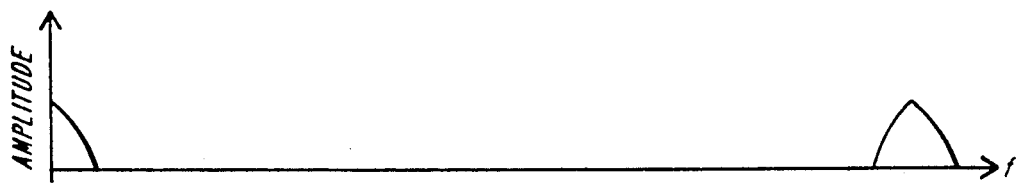
Figure 18C:
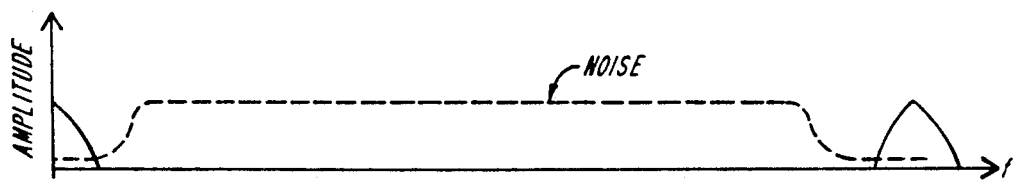
Figure 18D:
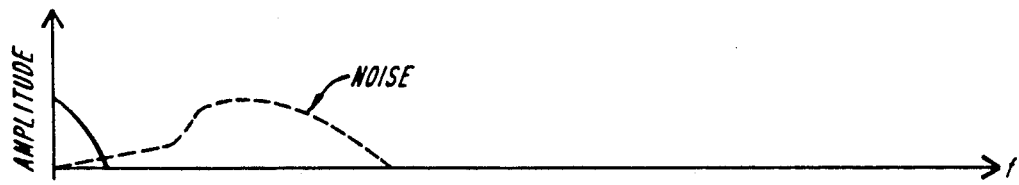

FIG. 16 shows a switched-capacitor implementation of the circuit shown in FIG. 15. The circuit in FIG. 15 is similar to FIG. 13 (with equivalent numeral designations) except that two additional summing capacitors, 1660 and 1661, have been added to the circuit as shown in the Figure. When the values of these capacitors are correctly chosen in accordance with conventional filter theory, the signal transfer function Y(z)/X(z) can be adjusted to be similar to the transfer function of a first-order low-pass filter. Accordingly, the transient response of the FIG. 15 circuit is significantly faster than that of the circuit of FIG. 13, which exhibits a third-order roll-off characteristic.

Figure 17:
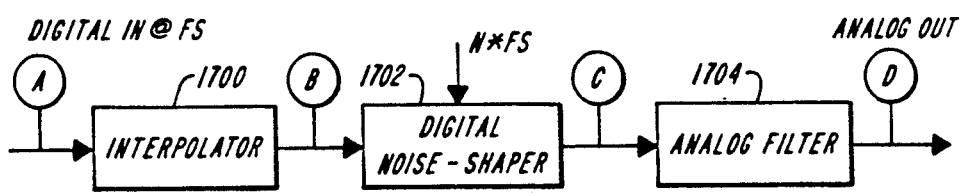
FIG. 17 is a simplified block schematic diagram of a digital-to-analog converter using a digital version of the inventive sigma delta, modulator as a noise shaping network.

It is also possible to construct the analog sigma delta modulator loop disclosed above as a completely digital circuit which processes single-bit digital signals. The circuit then acts as a digital noise shaper which can be used in a digital digital-to-analog converter. A simplified block diagram of such a circuit is shown in FIG. 17 and consists of a digital interpolator circuit 1700 followed by a digital noise-shaper 1702 which is, in turn, followed by an analog filter 1704.

The input (A) to such a device would be a multi-bit digital signal that is generated from an analog signal by conventional sampling and digitizing circuits. For example, for input signals in the audio band, the digital input would typically be a 16 to 18-bit digital signal at a sampling rate ($f_s$) of 44.1 kHz. A frequency spectrum plot of such a signal is shown on line A of FIG. 18. The input signal is applied to a conventional digital interpolating filter which increases the effective sampling rate to a multiple of the original rate ($N*F_s$) and removes the intermediate spectral images as shown on line B of FIG. 18. For example, in a typical circuit, for a input signal sampled at a 48 kHz rate, the output sampling rate might be approximately six mHz.

The signal shown on line B of FIG. 18 is then applied to the inventive noise-shaper circuit which has a similar architecture to the analog sigma delta modulator discussed above except that it operates on digital signals. In accordance with the above discussion, the noise-shaper circuit is clocked at a frequency approximately the same as the sampling rate of interpolator 1700 and produces an output which is a one-bit digital signal at the higher sampling rate. It is not necessary that the word rate of the signal coming out of interpolator 1700 exactly match the clocking rate of noise shaper 1702 for proper circuit operation. For example, if the word rate of the signal generated by interpolator 1700 is lower than the clocking rate of noise-shaper 1702, then noise-shaper 1702 will simply use the same input value for several clock cycles.

The output of digital noise shaper 1702 has a spectral signal as shown on line C of FIG. 18 which includes the desired signal spectrum plus substantial amounts of out-of-band quantization noise as discussed above. This output signal is then passed through analog filter 1704 to recover the original analog signal. The result of analog filtering is shown on line D of FIG. 18 in which the out-of-band noise is substantially reduced.

Figure 19:
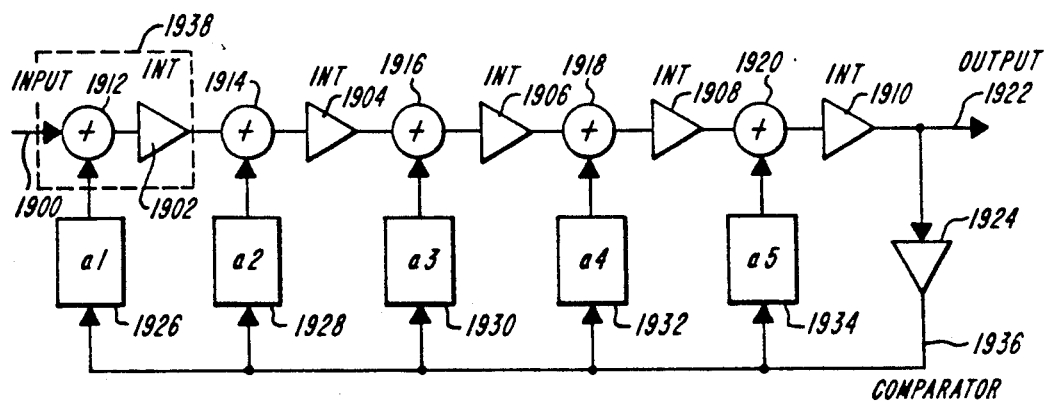
FIG. 19 is a more detailed block diagram of the digital noise-shaper circuit illustrated in FIG. 17.

FIG. 19 shows an illustrative structure for the digital noise shaper 1702. The structure consists of a five-pole filter with all poles located at D.C. frequency. It accepts a multi bit digital input and generates a single bit output. The overall topology of this filter is equivalent to the analog/digital structure discussed above in connection with FIG. 8A with the exception that all signals within the filter are digital. In addition, the structure shown in FIG. 19 is slightly simpler than the filter show in FIG. 8B because it does not have feedback loops around pairs of integrators to construct resonators.

The filter consists of five integrators 1902-1910 connected in series, each having a feedback summing junction 1912-1920 at its input. The input 1900 is fed into the first summing junction 1912 and the filter output 1922 is applied to a comparator 1924 to generate the digital feedback. The single-bit feedback signal at the output 1936 of comparator 1924 is applied in parallel to coefficient generators 1926-1934 to generate feedback coefficients a1-a5.

The implementation of the structure shown in FIG. 19 is greatly simplified since comparator output 1936 is a one-bit signal. Consequently, coefficient generators 1926-1934 ca be operated directly by the feedback signal and digital multipliers are not necessary to generate the feedback signals for each filter stage. Although not necessary, it is also possible to further simplify the structure if the feedback coefficients are rounded to the nearest power of two. In this case, the feedback signals are each single bit signals which can be generated by connecting the output 1936 of comparator 1924 to an appropriate tap at each input of summing adders 1912-1920. Since, the circuit shown in FIG. 19 is pipelined (each integrator has a delay of only one clock cycle), the maximum number of additions that must be performed during any clock cycle is two—one addition for the feedback and one addition in the integrator itself.

Figure 20:
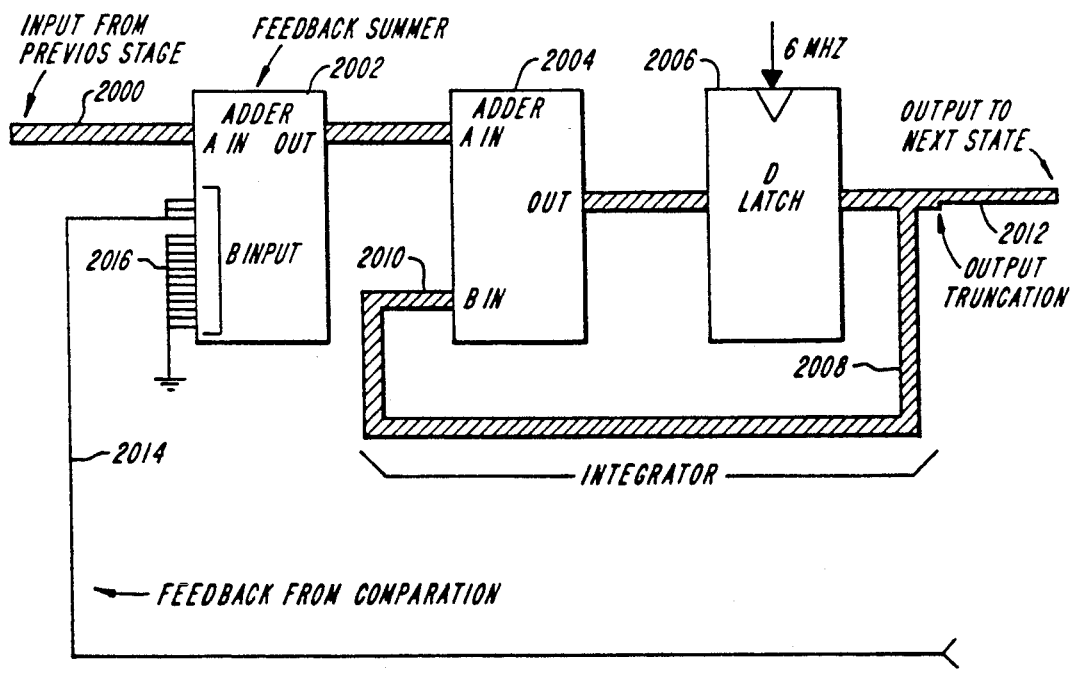
FIG. 20 is a still more detailed block diagram of a feedback-summer integrator unit used in the digital noise-shaper circuit of FIG. 19.

FIG. 20 is an expanded block diagram of a single filter stage such as that shown in the dotted box 1938 in FIG. 19. In the digital implementation, the integrator is simply an accumulator register with feedback from the output of the register back to the input. The accumulator register is a D-type register 2006 clocked at the multiple sampling rate frequency whose inout is the output of a digital adder 2004. The output 2008 of register 2006 is applied to the adder input 2010.

A second digital adder 2002 is provided at the input of adder 2006 to add the feedback signal from the comparator. As mentioned above, if the feedback signal is selected to be a single bit or a small number of bits, the feedback effects only the several most significant bits of the input signal and consequently, the least significant bits of the adder (B) input can be grounded as shown at 2016. Thus, adder 2002 is effectively only a few bits wide.

In a similar manner, depending on the signal-to-noise ratio desired, the output 2012 of each filter stage can be truncated with only the mos significant bits passed to the next filter stage. The number of bits to be passed to the next stage can be determined either empirically or by simulating the circuit in a conventional fashion. When the filter outputs are truncated, each successive filter stage becomes simpler as the number of input bits decreases.

Comparator 1920 can be implemented in the digital circuit by simply taking the most significant bit of the last filter stage as the filter and comparator output. Since all of the digital mathematics ar typically done with two's complement arithmetic, the most significant bit of the last filter stage is the sign bit and indicates whether the output number is greater than or less than zero. This output may be passed directly to the digital-to-analog converter output or passed through a discrete-time analog filter to reconstruct the analog signal and remove high-frequency shape noise produced by the noise-shaper circuit.

Although only a few illustrative embodiments have been discussed, other modifications and changes will become immediately apparent to those skilled in the art. For example, although only passive filter elements have been illustrated in the illustrative embodiments, those skilled in the art could readily design an equivalent circuit using active filter elements in accordance with the principles and teaching of the invention. These changes and modifications are intended to be covered by the following claims.

What is claimed is:

1. A digital noise shaper circuit for generating an output digital data stream having predefined noise characteristics and a predefined frequency bandwidth from a multi-bit input digital data stream, said noise shaper comprising;

a greater than two-pole digital noise-shaping filter network for receiving and processing an error signal to generate said output data stream;

means responsive to said output stream for generating a feedback signal;

means responsive to said feedback signal for frequency-shaping said feedback signal; and means for digitally adding said multi-bit input digital data stream and said frequency-shaped feedback signal to generate said error signal, so that the combination of said digital filter and said feedback signal shapes quantization noise generated when said noise shaper circuit converts said input digital data stream into said output data stream in order to shift most of said quantization noise to frequencies outside of said predefined frequency bandwith wherein the number of bits in the output digital data stream is less than the number of bits in the input digital data stream.

2. A digital noise shaper circuit according to claim 1 wherein said frequency-shaping means comprises a feedback processing network connected between said feedback signal generating means and said adding means.

3. A digital noise shaper circuit according to claim 1 wherein said feedback signal generating means is the most significant bit of said output data stream.

4. A digital noise shaper circuit according to claim 1 wherein said multi-pole digital filter network is comprised of at least two digital accumulators.

5. A digital noise shaper circuit according to claim 1 wherein said multi-pole digital filter network is comprised of a plurality of filter stages, each of said filter stages being comprised of a digital adder with an output connected to a digital accumulator.

6. A digital noise shaper circuit for generating a single-bit pulse-density modulated output digital data stream having predefined noise characteristics from a multi-bit input digital data stream, said noise shaper comprising:
- a greater than two-pole digital filter network for receiving and processing an error signal to generate said output data stream;
- a comparator responsive to said output stream for generating a feedback signal;
- means responsive to said feedback signal for frequency-shaping said feedback signal; and
- means for digitally adding said multi-bit input digital data stream and said frequency-shaped feedback signal to generate said error signal.

7. A digital noise shaper circuit for generating a single-bit pulse-density modulated output digital data stream having predefined noise characteristics from a multi-bit input digital data stream, said noise shaper comprising:
- a greater than two-pole digital filter network for receiving and processing an error signal to generate said output data stream;
- a comparator responsive to said output stream for generating a feedback signal;
- means responsive to said feedback signal for frequency-shaping said feedback signal comprising means for multiplying said feedback signal by a predetermined digital number; and
- means for digitally adding said multi-bit input digital data stream and said frequency-shaped feedback signal to generate said error signal.

8. A digital noise shaper circuit for generating a single-bit pulse-density modulated output digital data stream having predefined noise characteristics from a multi-bit input digital data stream, said noise shaper comprising:
- a greater than two-pole digital filter network for receiving and processing an error signal to generate said output data stream, said multi-pole digital filter network being comprised of a plurality of filter stages, each of said filter stages being comprised of a digital adder with an output connected to a digital accumulator;
- means responsive to said output stream for generating a feedback signal;
- means responsive to said feedback signal for frequency-shaping said feedback signal comprising a plurality of frequency-shaping circuits and said digital adder in each of said filter stages has a first input connected to a filter stage input and a second input connected to one of said frequency-shaping circuits; and
- means for digitally adding said multi-bit input digital data stream and said frequency-shaped feedback signal to generate said error signal.

* * * * *